United States Patent
Kelkar et al.

(10) Patent No.: US 9,219,043 B2
(45) Date of Patent: Dec. 22, 2015

(54) WAFER-LEVEL PACKAGE DEVICE HAVING HIGH-STANDOFF PERIPHERAL SOLDER BUMPS

(71) Applicant: Maxim Integrated Products, Inc., San Jose, CA (US)

(72) Inventors: Amit S. Kelkar, Flower Mound, TX (US); Viren Khandekar, Flower Mound, TX (US); Hien D. Nguyen, The Colony, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 113 days.

(21) Appl. No.: 13/930,788

(22) Filed: Jun. 28, 2013

(65) Prior Publication Data

US 2014/0264845 A1   Sep. 18, 2014

Related U.S. Application Data

(60) Provisional application No. 61/779,635, filed on Mar. 13, 2013.

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 25/065* | (2006.01) |
| *H01L 25/00* | (2006.01) |

(52) U.S. Cl.
CPC ............... *H01L 24/11* (2013.01); *H01L 24/92* (2013.01); *H01L 25/0657* (2013.01); *H01L 25/50* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2224/1132* (2013.01); *H01L 2224/1134* (2013.01); *H01L 2224/1145* (2013.01); *H01L 2224/1146* (2013.01); *H01L 2224/1182* (2013.01); *H01L 2224/11312* (2013.01); *H01L 2224/11334* (2013.01); *H01L 2224/11436* (2013.01); *H01L 2224/11462* (2013.01); *H01L 2224/11849* (2013.01); *H01L 2224/131* (2013.01); *H01L 2224/136* (2013.01); *H01L 2224/13111* (2013.01); *H01L 2224/13147* (2013.01); *H01L 2224/13564* (2013.01); *H01L 2224/16145* (2013.01); *H01L 2224/16225* (2013.01); *H01L 2224/2919* (2013.01); *H01L 2224/32145* (2013.01); *H01L 2224/73103* (2013.01); *H01L 2224/73204* (2013.01); *H01L 2224/81815* (2013.01); *H01L 2224/8385* (2013.01); *H01L 2224/83191* (2013.01); *H01L 2224/83851* (2013.01); *H01L 2224/92242* (2013.01); *H01L 2225/06513* (2013.01); *H01L2225/06541* (2013.01); *H01L 2924/351* (2013.01)

(58) Field of Classification Search
None
See application file for complete search history.

(56) References Cited

U.S. PATENT DOCUMENTS

| | | | |
|---|---|---|---|
| 2011/0223721 A1* | 9/2011 | Cho et al. | 438/127 |
| 2013/0153016 A1* | 6/2013 | Ru | 136/256 |

*Primary Examiner* — Sonya D McCall Shepard
(74) *Attorney, Agent, or Firm* — Advent, LLP (57) ABSTRACT

A wafer-level package device and techniques for fabricating the device are described that include a second integrated circuit chip electrically coupled to a base integrated circuit chip, where the second integrated circuit chip is placed on and connected to the base integrated circuit chip between multiple high-standoff peripheral pillars with solder bumps. In implementations, the wafer-level package device that employs example techniques in accordance with the present disclosure includes a base integrated circuit chip, multiple high-standoff peripheral pillars with solder bumps, and a second integrated circuit chip electrically coupled to the base integrated circuit chip and placed on the base integrated circuit chip in the center of an array of high-standoff peripheral pillars with solder bumps.

20 Claims, 5 Drawing Sheets

WAFER-LEVEL PACKAGE DEVICE HAVING HIGH-STANDOFF PERIPHERAL SOLDER BUMPS

CROSS-REFERENCE TO RELATED APPLICATIONS

The present application claims the benefit under 35 U.S.C. §119(e) of U.S. Provisional Application Ser. No. 61/779,635, filed Mar. 13, 2013, and titled "WAFER-LEVEL PACKAGE DEVICE HAVING HIGH-STANDOFF PERIPHERAL SOLDER BUMPS." U.S. Provisional Application Ser. No. 61/779,635 is herein incorporated by reference in its entirety.

BACKGROUND

Packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

SUMMARY

Techniques are described for fabricating wafer-level package semiconductor devices that have form factors similar to those of devices that employ flat no-lead (e.g., QFN) packaging technologies. In one or more implementations, the wafer-level package devices include an integrated circuit chip (e.g., die) having at least one pillar (e.g., a copper pillar) formed over the integrated circuit chip. The pillar is configured to provide electrical interconnectivity to the integrated circuit chip. An encapsulation structure configured to support the pillar is formed over the surface of the integrated circuit chip. In one or more implementations, a second integrated circuit device may be mounted to the integrated circuit chip so that the integrated circuit device is in electrical communication with the integrated circuit chip. The second integrated circuit device is at least partially encapsulated by the encapsulation structure.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level. Compared to some packaging techniques (e.g., flat no-lead (QFN)), wafer-level packaging is generally less costly to implement since packaging occurs at wafer level, while flat no-lead packaging is performed at strip level.

As the number of computer applications grow, a greater amount of processing functionality and storage functionality provided by integrated circuitry may be required. However, the greater the number of circuitry required may correlate to a greater amount of physical space required in multi-media devices. A 3D die can be constructed using two or more layers of electronic components integrated into a single device, often from stacking and processing semiconductor wafers. The electronic components may be stacked to form a single electrical circuit. It is advantageous to embed silicon chips onto an active device wafer for 3D integration in order to preserve physical space and provide increased functionality.

Accordingly, a device and fabrication techniques are described that include a second integrated circuit chip electrically coupled to a base integrated circuit chip, where the second integrated circuit chip is placed on and connected to the base integrated circuit chip between multiple high-standoff peripheral pillars with solder bumps. In implementations, the wafer-level package device that employs example techniques in accordance with the present disclosure includes a base integrated circuit chip, multiple high-standoff peripheral pillars with solder bumps, and a second integrated circuit chip electrically coupled to placed on the base integrated circuit chip in the center of an array of high-standoff peripheral pillars with solder bumps. In implementations, a process for fabricating the wafer-level package device that employs example techniques in accordance with the present disclosure includes forming at least one pillar on a processed base integrated circuit chip, where the at least one pillar has a high-standoff peripheral arrangement, and placing a second integrated circuit chip device on the base integrated circuit chip device in the center of the at least one pillar having the high-standoff peripheral arrangement. Once singulated from the wafer, the devices may be mounted to a printed circuit board or other semiconductor device to form an electronic device, and the solder bumps may provide electrical connections that interface with pads of a printed circuit board.

Example Implementations

Figure 1A:
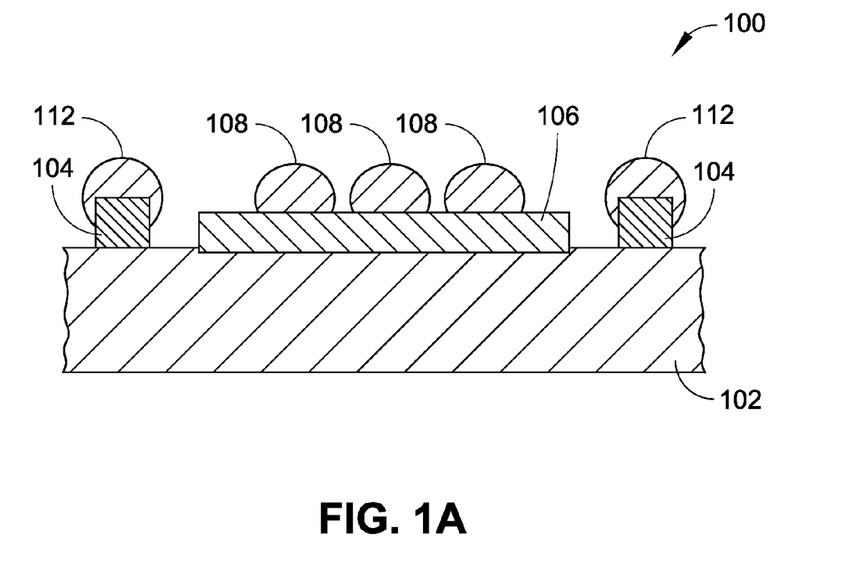
FIG. 1A is a diagrammatic partial cross-sectional side elevation view illustrating a wafer-level package device in accordance with an example implementation of the present disclosure, wherein the wafer-level package device includes a single device configuration having a base integrated circuit chip device, at least one pillar with a high standoff peripheral arrangement formed on the base integrated circuit chip device, and a second integrated circuit chip device electrically coupled to the base integrated circuit chip device.
Figure 1B:
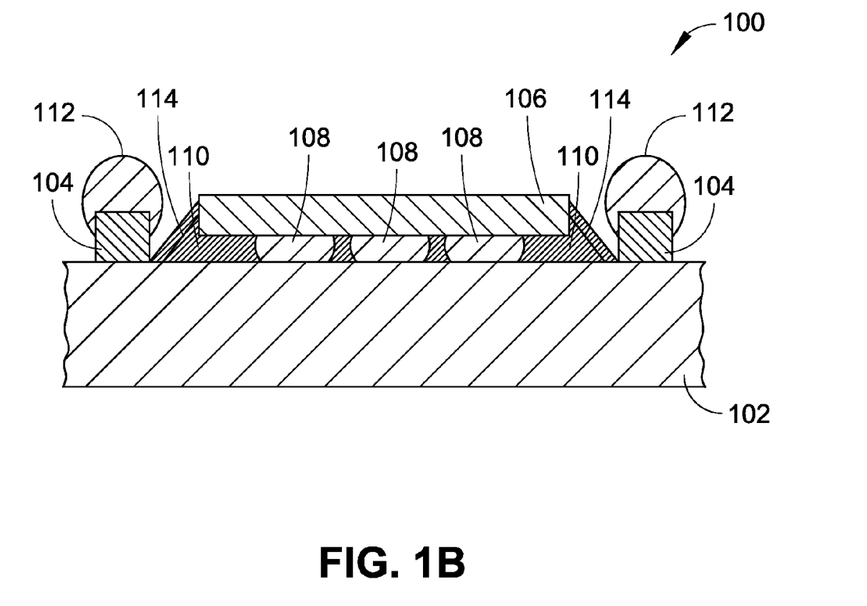
FIG. 1B is a diagrammatic partial cross-sectional side elevation view illustrating a wafer-level package device in accordance with an example implementation of the present disclosure, wherein the wafer-level package device includes a single device configuration having a base integrated circuit chip device, at least one pillar with a high standoff peripheral arrangement formed on the base integrated circuit chip device, and a second integrated circuit chip device electrically coupled to the base integrated circuit chip device.

FIG. 1 illustrates a wafer level package device 100 in accordance with example implementations of the present disclosure. In some implementations, the wafer level package device 100 may include wafer-level integrated circuit package devices. As shown in FIGS. 1A and 1B, the wafer level package device 100 includes a base integrated circuit chip 102 including one or more integrated circuits formed therein. The base integrated circuit chip 102 may be included as a portion of a semiconductor wafer substrate, such as a silicon wafer (e.g., p-type wafer, n-type wafer, and so forth), a germanium wafer, and so forth, that includes one or more integrated circuits formed therein. The integrated circuits may be formed through suitable front-end-of-line (FEOL) fabrication techniques near the surface of the semiconductor wafer substrate. In various implementations, the integrated circuits may include digital integrated circuits, analog integrated circuits, mixed signal integrated circuits, combinations thereof, and so forth.

As shown in FIGS. 1A through 1B, the wafer level package device 100 includes at least one pillar 104 having a high standoff peripheral arrangement. In some implementations, a high standoff peripheral arrangement pillar 104 may include a pillar 104 having a height greater than a second integrated circuit chip 106 (and any additional structure on the second integrated circuit chip 106), where the second integrated circuit chip 106 is configured to be placed in the center of an array of high standoff peripheral pillars 104 and where the second integrated circuit chip 106 is coupled to the base integrated circuit chip 102. In one implementation, the wafer level package device 100 includes pillars 104 that are copper pillars fabricated via suitable manufacturing processes, such as a dual lamination/deposition process. Other processes may also be utilized to fabricate the pillars 104, for example, a copper plating process. The pillars 104 may serve to provide electrical interconnections between the base integrated circuit chip 102 and another semiconductor device (e.g., another integrated circuit chip, a printed circuit board, etc.) as well as function as a physical barrier to crack propagation, reduce solder stress, and reduce solder current density (e.g., slowing electrical migration). In a specific implementation, the wafer level package device 100 includes an array of twenty pillars 104 having a high standoff peripheral arrangement, where the pillars are configured so that the second integrated circuit chip 106 can be placed in the center of the array of pillars 104.

Additionally, each pillar 104 may include a solder bump 112 disposed on one end of the pillar 104 configured to function as an electrical/mechanical connection to another semiconductor device. In these embodiments, the pillar 104 extends at least partially into the solder bump 112 to mitigate thermal stresses to the solder bumps 112. In implementations, the solder bump 112 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) allow solder, and so on. In implementations, an array of high standoff peripheral pillars 104 with solder bumps may include pillars 104 configured to elevate the solder bumps 112 to a height generally higher than the height of a second integrated circuit chip 106. In these implementations, the elevated solder bumps 112 may be configured to function as an electrical/mechanical connection to another semiconductor or electrical device (e.g., a printed circuit board, an integrated circuit chip, etc.). The wafer level package devices 100 may thus provide mechanical protection of the second integrated circuit chip 106 disposed between the high standoff peripheral pillars 104 with solder bumps 112 contained within the device packages that is similar to that provided by other devices, while maintaining the benefits inherent in wafer-level packaging (e.g., lower cost, smaller package size, high pin count, etc.). Additionally, the high standoff peripheral pillars 104 with solder bumps 112 may better enable a compact 3D IC wafer-level package and provide increased functionality.

As shown in FIGS. 1A and 1B, the wafer level package device 100 includes a second integrated circuit chip 106 coupled to the base integrated circuit chip 102. The second integrated circuit chip 106 may include one or more integrated circuits formed therein, which may include digital integrated circuits, analog integrated circuits, mixed signal integrated circuits, combinations thereof, etc. The second integrated circuit chip 106 may be coupled to the base integrated circuit chip 102 in various ways. In some implementations and as illustrated in FIG. 1A, the second integrated circuit chip 106 may be coupled to the base integrated circuit chip 102 using an adhesive compound. In these implementations, the second integrated circuit chip 106 may be electrically connected to the base integrated circuit chip 102 with through-silicon vias ("TSVs"), for example. In other implementations, the second integrated circuit chip 106 may be electrically connected to the base integrated circuit chip 102 with wire leads. When the second integrated circuit chip 106 is coupled with an adhesive to the base integrated circuit chip 102, an array of solder bumps 108 may be disposed on a side of the second integrated circuit chip 106 (e.g., opposite of the side configured to be adhered to the base integrated circuit chip 102), where the solder bumps 108 are configured to function as an electrical connection to another electrical or semiconductor device (e.g., a printed circuit board, an integrated circuit chip, etc.). Additionally, the solder bump 108 array disposed on the second integrated circuit chip 106 may be located at approximately the same height as the solder bump(s) 112 disposed on the high standoff peripheral pillars 104 so that the solder bump(s) 108 disposed on the second integrated circuit chip 106 may be electrically coupled to the same electrical or semiconductor device as the solder bumps 112 on the high standoff peripheral arranged pillars 104.

In other implementations and as illustrated in FIG. 1B, the second integrated circuit chip 106 may be coupled to and in electrical communication with the base integrated circuit chip 102 using an array of solder bumps 108 and/or wire leads 114. In this implementation, the second integrated circuit chip 106 may be coupled to the base integrated circuit chip 102 and disposed in the center of an array of high standoff peripheral pillar(s) 104. When the second integrated circuit chip 106 is coupled to the base integrated circuit chip 102 with a solder bump 108 array, the surface of the second integrated circuit chip 106 may be located below the solder bump(s) 112 disposed on the high standoff peripheral pillar(s) 104. In implementations, the second integrated circuit chip 106 may be electrically coupled to the base integrated circuit chip 102 or another electronic device using other methods or combinations of methods (e.g., wire leads, solder bumps, TSVs, a redistribution layer ("RDL"), etc.). Placement of the second integrated circuit chip 106 may include being mounted over and to the surface of the base integrated circuit chip 102. In some implementations, the second integrated circuit chip 106 may be positioned over an electrical interconnection structure (e.g., a redistribution layer, a solder ball array, a lead frame, etc.) disposed on the base integrated circuit chip 102 while the second integrated circuit chip 106 is disposed in the center of the array of high standoff peripheral pillar(s) 104.

As illustrated in FIG. 1B, the wafer level package device 100 may include an underfill layer 110 disposed between the second integrated circuit chip 106 and the base integrated circuit chip 102 in the open spaces between the solder bumps 108. The underfill layer 110 may function to protect the solder bumps 108 and a portion of the second integrated circuit chip 106 from moisture, contaminants, and other environmental hazards. In embodiments, the underfill layer 110 may mechanically couple the second integrated circuit chip 106 surface to the base integrated circuit chip 102, thereby reducing the differences between the expansion of the second integrated circuit chip 106 and the base integrated circuit chip 102. The underfill layer 110 also prevents the solder bumps 108 from being damaged by shear stresses caused by differences between the thermal expansions of the second integrated circuit chip 106 and the base integrated circuit chip 102. In implementations, the underfill layer 110 includes a non-conductive material (e.g., an epoxy-based resin) disposed substantially under the second integrated chip 106.

Additional layers (e.g., electrical interconnections, encapsulation layers, dielectric and/or passivation layers, and/or layers configured to function as electrical/mechanical/structural support, encapsulation layers, etc.) may be added to the wafer-level package device 100 beyond the second integrated circuit chip 106 and the high standoff peripheral pillars 104. Further, the wafer-level package device 100 may be singulated into individual semiconductor devices subsequent to the formation of additional layers and coupled to a printed circuit board (not shown), thereby forming an electronic device. A printed circuit board may include a circuit board used to mechanically support and electrically connect electronic components (e.g., the individual semiconductor devices) using conductive pathways, tracks or signal traces etched from copper sheets laminated onto a non-conductive substrate. Thus, the second integrated circuit chip 106 extends additional functionality to the wafer level package device 100 by enabling system-in-a-package capabilities.

Example Fabrication Processes

Figure 2:
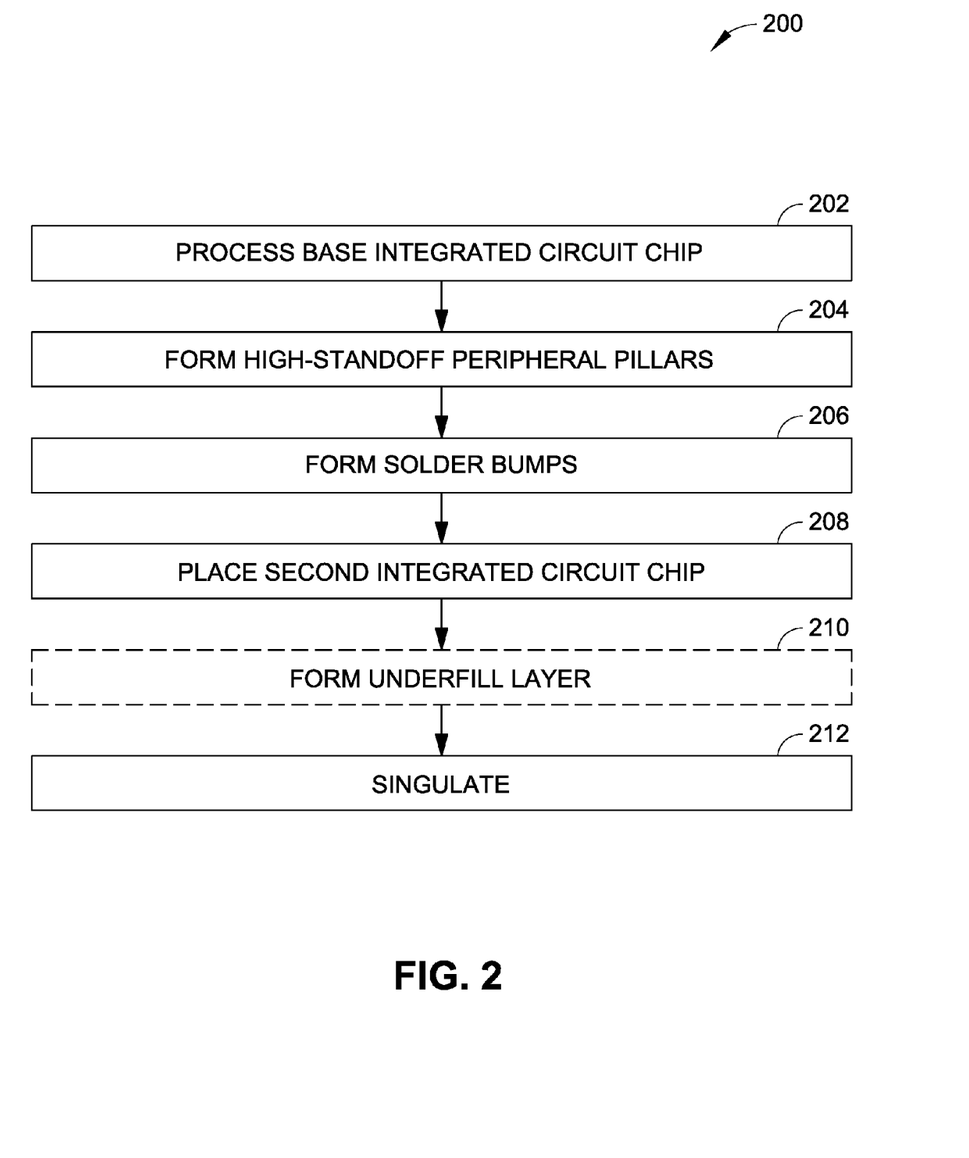
FIG. 2 is a flow diagram illustrating a process in an example implementation for fabricating wafer-level package devices, such as the devices shown in FIGS. 1A and 1B.

FIG. 2 illustrates an example process 200 that employs wafer-level packaging techniques to fabricate semiconductor devices including a second integrated circuit chip 106 disposed in the center of multiple high standoff peripheral pillars 104 with solder bumps 112, such as the wafer level package device 100 shown in FIGS. 1A through 1B. FIGS. 3A through 3F illustrate sections 300 of an example base integrated circuit chip 302, second integrated circuit chip 306, and high standoff peripheral pillar 304 array that are utilized to fabricate semiconductor devices (such as wafer level package device 100 shown in FIGS. 1A and 1B).

Figure 3A:
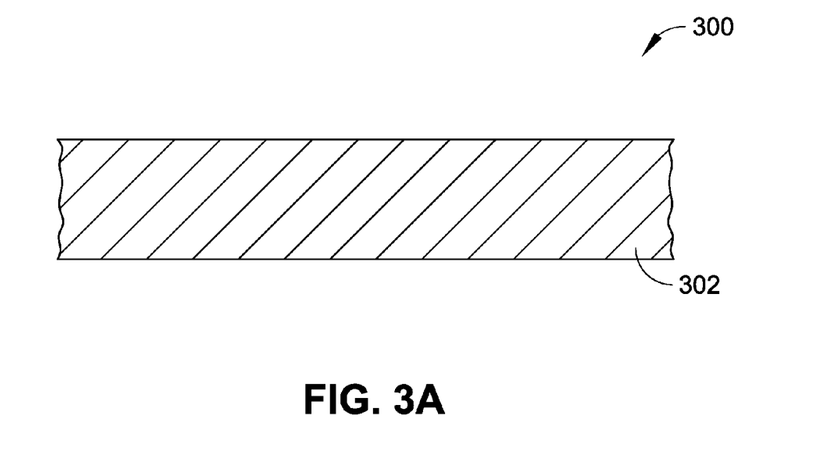
FIG. 3A is a diagrammatic partial cross-sectional side elevation view illustrating the fabrication of a wafer-level package device, such as the device shown in FIGS. 1A and 1B, in accordance with the process shown in FIG. 2.

Accordingly, a base integrated circuit chip is processed (Block 202). FIG. 3A illustrates a portion of the base integrated circuit chip 302, which, when processed through suitable FEOL fabrication techniques, includes a semiconductor substrate that includes one or more integrated circuits formed therein. Processing the base integrated circuit chip 302 may include processing a portion of a semiconductor wafer substrate, such as a silicon wafer (e.g., p-type wafer, n-type wafer, and so forth), a germanium wafer, and so forth, that includes one or more integrated circuits formed therein. The processed integrated circuits may be configured in a variety of ways. For example, the processed integrated circuits may be digital integrated circuits, analog integrated circuits, mixed-signal integrated circuits, and so forth. The processed integrated circuits are connected to one or more conductive layers (e.g., bump interfaces, redistribution layers, etc.) that provide electrical contacts through which the integrated circuits are interconnected to other components associated with the base integrated circuit chip 302, such as printed circuit boards, a second integrated circuit chip 306, etc. In an implementation, processing a base integrated circuit chip 302 includes processing a silicon wafer configured to receive a pick-and-placed second integrated circuit chip 306, where the silicon wafer has been processed using FEOL techniques.

Figure 3B:
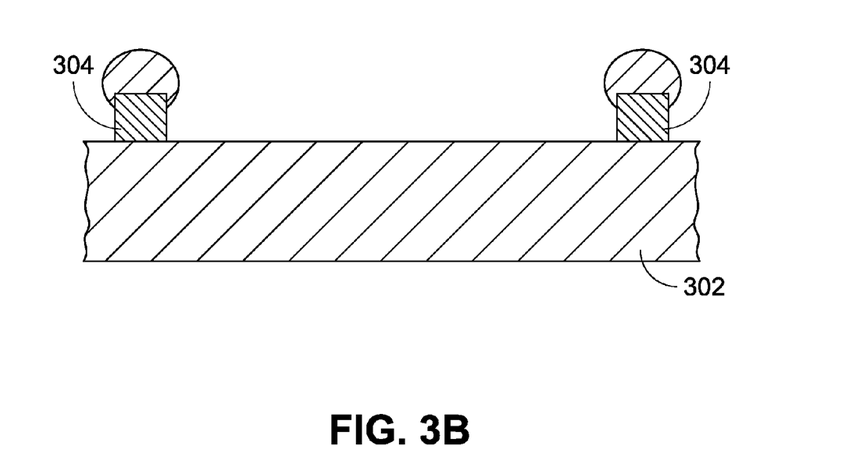
FIG. 3B is a diagrammatic partial cross-sectional side elevation view illustrating the fabrication of a wafer-level package device, such as the device shown in FIGS. 1A and 1B, in accordance with the process shown in FIG. 2.
Figure 3C:
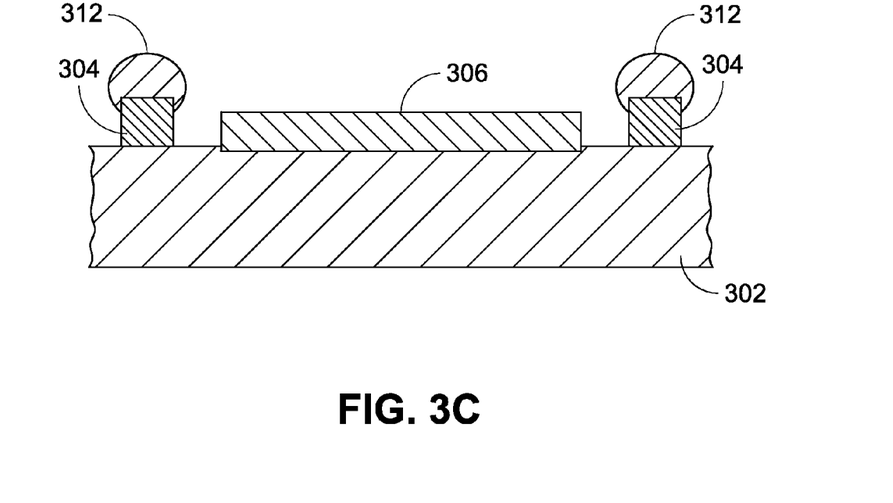
FIG. 3C is a diagrammatic partial cross-sectional side elevation view illustrating the fabrication of a wafer-level package device, such as the device shown in FIGS. 1A and 1B, in accordance with the process shown in FIG. 2.

At least one high standoff peripheral pillar is formed on the base integrated circuit chip (Block 204). FIG. 3B illustrates forming an array of high standoff peripheral pillars 304. The high standoff peripheral pillars 304 may be formed using various methods. In an implementation, forming a high standoff peripheral pillar 304 includes using a suitable copper plating process. In another embodiment, forming a high standoff peripheral pillar 304 includes using a lamination/deposition process. The size, shape, and dimensions of the high standoff peripheral pillars 304 may vary according to the various design/fabrication considerations of the wafer level package device 100. In implementations, the high standoff peripheral pillars 304 are generally formed to a height greater than the second integrated circuit chip 306. When the second integrated circuit chip 306 is processed with an array of solder bumps 308 on a side of the second integrated circuit chip 306 farthest from the base integrated circuit chip 302, the high standoff peripheral pillars 304 may be formed at a height where the solder bumps 308 are approximately equal in height to the solder bumps 312. In one embodiment, the high standoff peripheral pillars 304 may extend from the base integrated circuit chip 302 to a height from about thirty-five micrometers (35 μm) to about sixty micrometers (60 μm). In some implementations, shapes of the high standoff peripheral pillars 304 may include a cylindrically-shaped cross-section, a rectangular cross-section, or a trapezoidal cross-section.

Forming the high standoff peripheral pillars 304 may include forming solder bumps 312 disposed on one end of the high standoff peripheral pillars 304 (e.g., opposite the base integrated circuit chip 302). In some embodiments, forming solder bumps 312 on the pillars 304 may include placing a flux on the pillar 304 and positioning a solder ball onto the pillar 304 on the flux. The solder ball may be held to the pillar 304 by the flux until the wafer level package device 100 is subjected to a suitable reflow process. The solder ball is then reflowed over the pillar 304 to form a solder bump 312.

Figure 3D:
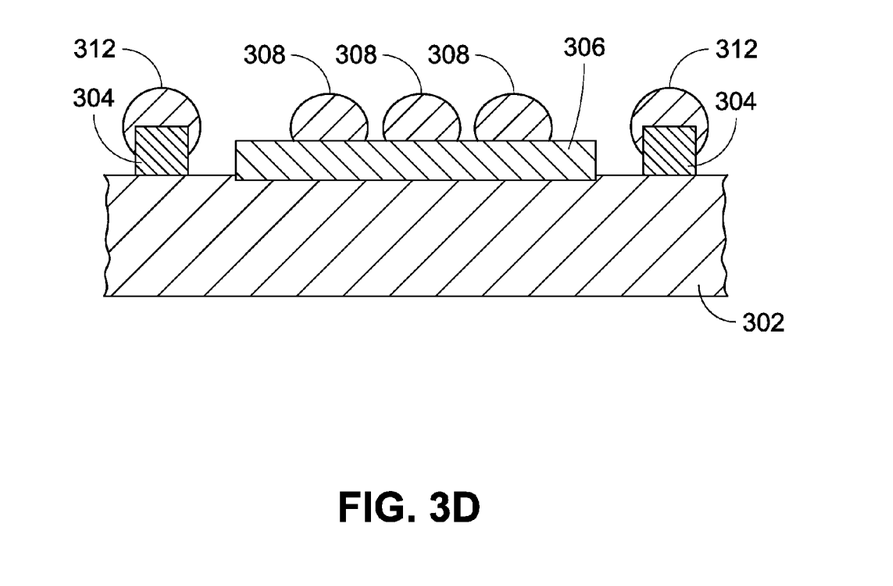
FIG. 3D is a diagrammatic partial cross-sectional side elevation view illustrating the fabrication of a wafer-level package device, such as the device shown in FIGS. 1A and 1B, in accordance with the process shown in FIG. 2.

Additionally, solder bumps may be formed on the second integrated circuit chip (Block 206). As illustrated in FIG. 3D, the second integrated circuit chip 306 may include solder bumps 308 configured to function as an electrical and/or mechanical connection between the second integrated circuit chip 306 and another device, such as the base integrated circuit chip 302. Forming the solder bumps 308 on the second integrated circuit chip 306 may include using a suitable deposition method (e.g. solder paste printing, evaporation, electroplating, jetting, stud bumping, etc.). In one implementation, forming solder bumps 308 include applying solder paste to predetermined locations on the second integrated circuit chip 306, where the solder paste is configured to be subsequently reflowed and form connections between the wafer level package device 100 and another component (e.g., printed circuit board, another integrated circuit chip, etc.). In an implementation, solder bumps 308 are formed on the second integrated circuit chip 306 using a ball-drop process. In this implementation, at least one solid, pre-formed solder ball may be dropped using a ball drop process. In another embodiment, forming at least one solder bump 308 on the second integrated circuit chip 306 includes placing a solder ball in a liquid or molten form on the second integrated circuit chip 306 (e.g., on a solder tab that is included as a portion of the second integrated circuit chip 306). In these embodiments, the solder ball may be bonded to the underlying second integrated circuit chip 306 to form solder bumps 308 by heating the solder ball and the contact material.

Figure 3E:
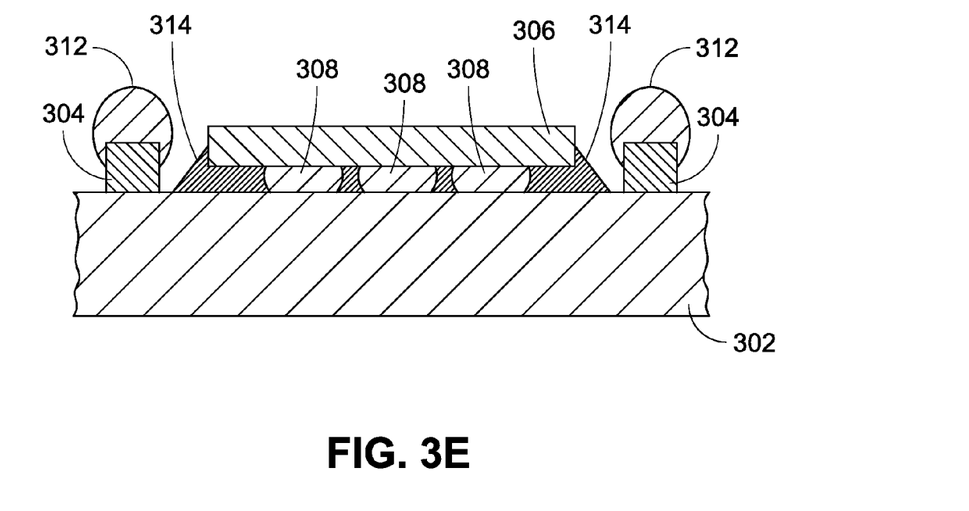
FIG. 3E is a diagrammatic partial cross-sectional side elevation view illustrating the fabrication of a wafer-level package device, such as the device shown in FIGS. 1A and 1B, in accordance with the process shown in FIG. 2.

The second integrated circuit chip is placed on the base integrated circuit chip (Block 208). The second integrated circuit chip 306 may be placed on the base integrated circuit chip 302 a variety of ways. In some implementations, the second integrated circuit chip 306 may be placed using surface mount technology and a pick-and-place machine. In some implementations and as shown in FIG. 3D, the second integrated circuit chip 306 may be attached to the base integrated circuit chip 302 using die attach technology employing an adhesive, such as polyimide, epoxy, or silver-filled glass. In some implementations, the adhesive may be dispensed in a controlled amount on the base integrated circuit chip 302, and the second integrated circuit chip 306 may be then attached to the base integrated circuit chip 302. In other implementations, the adhesive may be dispensed in a controlled amount on the second integrated circuit chip 306 before placing the second integrated circuit chip 306 on the base integrated circuit chip 302. In some implementations and as shown in FIG. 3E, the second integrated circuit chip 306 may be placed on the base integrated circuit chip 302 using flip chip technology. In these implementations, placing or mounting the second integrated circuit chip 306 to circuitry (e.g, a circuit board, the base integrated circuit chip 302, etc.) may include flipping the second integrated circuit chip 306 (e.g., a flip chip) so that a side with electrical connections (e.g., solder bumps 308) faces down, and the second integrated circuit chip 306 may be aligned so that its solder bumps 308 (or other electrical connection structure) align with matching pads on the base integrated circuit chip 302. A subsequent reflow process may be used to melt the solder bumps and secure the solder to the bump interfaces. Additional processes may be used to place and attach the second integrated circuit chip 306 to the base integrated circuit chip 302, such as wirebonding at least one wire lead 314 configured to function as an electrical connection between the second integrated circuit chip 306 to the base integrated circuit chip 302.

Figure 3F:
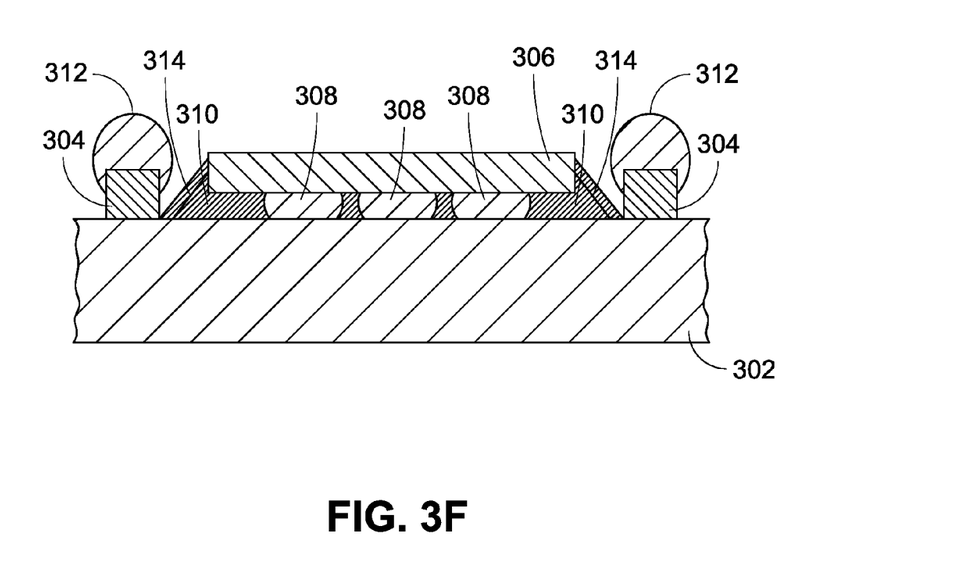
FIG. 3F is a diagrammatic partial cross-sectional side elevation view illustrating the fabrication of a wafer-level package device, such as the device shown in FIGS. 1A and 1B, in accordance with the process shown in FIG. 2.

Next, an underfill layer may be formed between the second integrated circuit chip and the base integrated circuit chip (Block 210). As shown in FIG. 3F, an underfill layer 310 may be formed in the open spaces (e.g., between the solder bumps) between the second integrated circuit chip 306 and the base integrated circuit chip 302. Forming the underfill layer 310 may include needle dispensation along the edges of the second integrated circuit chip 306. Capillary action then draws the dispensed underfill material (e.g., a non-conductive material, such as a polymer or epoxy) inwards until the open spaces are filled. Subsequently, thermal curing is performed to form a permanent bond.

The wafer-level package device 100 is then subjected to a singulation process (Block 212) to singulate the wafer-level package device into individual stacked die (e.g., stacked semiconductor package devices). The singulation process may include using conventional singulation techniques (die-sawing, scribe-and-break techniques, etc.)

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level package device comprising:
   a base integrated circuit chip including an integrated circuit;
   at least one pillar formed on a first side of the base integrated circuit chip device, where the at least one pillar has a high standoff peripheral arrangement and includes at least one solder bump formed on the pillar; and
   a second integrated circuit chip device electrically coupled to the first side of the base integrated circuit chip device, the second integrated circuit chip device disposed in a center of the at least one pillar with the high standoff peripheral arrangement, where the second integrated circuit chip device includes at least one solder bump formed on a side distal from the first side of the base integrated circuit chip.

2. The wafer-level package device as recited in claim 1, wherein the base integrated circuit chip includes a silicon wafer.

3. The wafer-level package device as recited in claim 1, wherein the at least one pillar includes at least one copper pillar.

4. The wafer-level package device as recited in claim 1, wherein the second integrated circuit chip device is coupled to the base integrated circuit chip with an adhesive and includes at least one solder bump on a side distal from the base integrated circuit chip.

5. The wafer-level package device as recited in claim 1, wherein the second integrated circuit chip device is coupled to the base integrated circuit chip with a solder bump array.

6. The wafer-level package device as recited in claim 5, further comprising an underfill layer disposed between the base integrated circuit chip device and the second integrated circuit chip, where the underfill layer surrounds the solder bump array.

7. The wafer-level package device as recited in claim 6, wherein the underfill layer comprises epoxy.

8. An electronic device comprising:
a printed circuit board; and
a wafer level-package device coupled to the printed circuit board, the wafer-level package device including
 a base integrated circuit chip device;
 at least one pillar formed on the base integrated circuit chip device, where the at least one pillar has a high standoff peripheral arrangement and includes at least one solder bump formed on the pillar; and
 a second integrated circuit chip device electrically coupled to the base integrated circuit chip, the second integrated circuit chip disposed in the center of the at least one pillar with the high standoff peripheral arrangement.

9. The wafer-level package device as recited in claim 8, wherein the base integrated circuit chip includes a silicon carrier wafer.

10. The wafer-level package device as recited in claim 8, wherein the at least one pillar includes at least one copper pillar.

11. The wafer-level package device as recited in claim 8, wherein the second integrated circuit chip device is coupled to the base integrated circuit chip with an adhesive and includes at least one solder bump on a side distal from the base integrated circuit chip.

12. The wafer-level package device as recited in claim 8, wherein the second integrated circuit chip device is coupled to the base integrated circuit chip with a solder bump array.

13. The wafer-level package device as recited in claim 12, further comprising an underfill layer disposed between the base integrated circuit chip device and the second integrated circuit chip, where the underfill layer surrounds the solder bump array.

14. The wafer-level package device as recited in claim 13, wherein the underfill layer comprises epoxy.

15. A process comprising:
forming at least one pillar on a first side of a processed base integrated circuit chip including integrated circuits formed in a segmented portion of a semiconductor wafer, where the at least one pillar has a high standoff peripheral arrangement, the at least one pillar including a solder bump;

placing a second integrated circuit chip device on the first side of the base integrated circuit chip device, where the second integrated circuit chip is disposed in a center of the at least one pillar having the high standoff peripheral arrangement, where the second integrated circuit chip device is configured to include at least one solder bump formed on a second integrated circuit chip device side distal from the first side of the base integrated circuit chip.

16. The process as recited in claim 15, wherein processing the first integrated circuit chip includes processing a silicon wafer.

17. The process as recited in claim 15, wherein forming the at least one pillar includes forming at least one copper pillar.

18. The process as recited in claim 15, wherein placing the second integrated circuit chip includes placing the second integrated circuit chip on the base integrated circuit chip using an adhesive.

19. The process as recited in claim 18, wherein placing the second integrated circuit chip on the base integrated circuit chip using an adhesive includes placing a solder bump array on a side of the second integrated circuit chip distal from the base integrated circuit chip.

20. The process as recited in claim 15, wherein placing the second integrated circuit chip includes placing the second integrated circuit chip on the base integrated circuit chip using a solder bump array.

* * * * *